United States Patent [19]
Reele et al.

[11] Patent Number: 5,246,880
[45] Date of Patent: Sep. 21, 1993

[54] METHOD FOR CREATING SUBSTRATE ELECTRODES FOR FLIP CHIP AND OTHER APPLICATIONS

[75] Inventors: Samuel Reele; Thomas R. Pian, both of Rochester, N.Y.

[73] Assignee: Eastman Kodak Company, Rochester, N.Y.

[21] Appl. No.: 874,462

[22] Filed: Apr. 27, 1992

[51] Int. Cl.⁵ .......................................... H01L 21/44
[52] U.S. Cl. ..................................... 437/183; 437/203
[58] Field of Search ................................ 437/183, 203

[56] References Cited

U.S. PATENT DOCUMENTS

| | | | |
|---|---|---|---|
| 3,535,773 | 10/1970 | Bakker et al. | 437/183 |
| 4,426,773 | 1/1984 | Hargis | 29/832 |
| 4,899,174 | 2/1990 | Newman et al. | 346/107 R |
| 4,970,571 | 11/1990 | Yamakawa et al. | 357/71 |
| 4,980,034 | 12/1990 | Volfson et al. | 204/38.4 |
| 4,991,000 | 2/1991 | Bone et al. | 355/75 |
| 5,027,188 | 6/1991 | Owada et al. | 357/68 |
| 5,149,671 | 9/1992 | Koh et al. | 437/183 |

FOREIGN PATENT DOCUMENTS

| | | | |
|---|---|---|---|
| 51866 | 4/1977 | Japan | 437/203 |
| 85247 | 5/1982 | Japan | 437/183 |
| 66953 | 3/1989 | Japan | 437/203 |
| 296646 | 11/1989 | Japan | 437/183 |

*Primary Examiner*—Brian E. Hearn
*Assistant Examiner*—Linda J. Fleck
*Attorney, Agent, or Firm*—Norman Rushefsky

[57] ABSTRACT

A method and apparatus for forming a conductive bump on a metal or other conductive surface or layer. A substrate is provided which includes the metal surface, a passivation layer next to the metal surface and an etch stop layer next to the passivation layer. The etch stop and passivation layers have a via therethrough which exposes a portion of the metal surface. At least one sacrificial layer is formed next to the etch stop layer. Each sacrificial layer has a via therethrough which has a larger diameter than, and which is essentially aligned with, the via in the layer located (i) next to the sacrificial layer and (ii) closer to the metal surface. The vias are filled with a conductive paste which is allowed to cure or harden. The sacrificial layer(s) is(are) removed to expose the bump.

7 Claims, 1 Drawing Sheet

METHOD FOR CREATING SUBSTRATE ELECTRODES FOR FLIP CHIP AND OTHER APPLICATIONS

TECHNICAL FIELD OF THE INVENTION

The present invention relates generally to a method for the creation of substrate electrodes (bumps) for flip chip and tape automated bonding (TAB) applications and, more specifically, to the use of successive sacrificial layers to form such a bump.

BACKGROUND ART

In recent years, with the advances made in the miniaturization of electronic devices, integration densities of IC (SSI, MSI, LSI and VLSI) chips have been greatly increased. In mounting of semiconductor elements onto a substrate, the distance (pitch) between electrodes has been reduced while the number of input/output(I/O) terminals has been increased. In card type calculators and IC cards, a demand has arisen for developing low-profile products which require short pitches.

Wireless bonding, such as TAB and flip chip, can advantageously realize collective bonding of electrodes and high-precision alignment between electrodes. As a result, low-profile and automatic mounting of semiconductor elements with high reliability can be expected. Therefore, wireless bonding has become a mainstream mounting technique for LSI chips.

In performing wireless bonding, metal projections known simply as bumps are generally formed on aluminum electrodes of LSI chips. The present methods and apparatus for creating these bumps suffer from several drawbacks. Obtaining a bump height which is substantially greater than the bump width is difficult to obtain. Bump-to-bump positional accuracy is hard to maintain. Bumps are expensive to create with the cost of extremely small bumps (e.g. 0.5 mils or smaller) being quite expensive.

SUMMARY OF THE INVENTION

In view of the foregoing discussion, an object of this invention is to provide a method for forming conductive bumps on a metal surface which overcomes the deficiencies of the prior art.

In accordance with the method of the invention, a substrate is provided which includes a metal or conductive surface, a passivation layer on top of the metal surface and an etch stop layer on top of the passivation layer. The etch stop and passivation layers have a via which passes through these layers and exposes a portion of the metal surface. At least one sacrificial layer is formed next to the etch stop layer. Each sacrificial layer has a via which passes through the layer and which has a larger diameter than, and which is essentially aligned with, the via in the layer located (i) next to the sacrificial layer and (ii) closer to the metal surface. The vias are filled with a conductive paste which is allowed to cure. The sacrificial layer(s) is(are) removed to expose the bump.

The invention, and its objects and advantages, will become more apparent in the detailed description of the preferred embodiments presented below.

BRIEF DESCRIPTION OF THE DRAWINGS

In the detailed description of the preferred embodiments of the invention presented below, reference is made to the accompanying drawings, in which.

BEST MODE FOR CARRYING OUT THE INVENTION

The following describes a method and apparatus for generating substrate electrodes, called bumps, for flip chip and TAB applications. This invention applies to full custom as well as semi-custom substrate fabrication.

Figure 1:
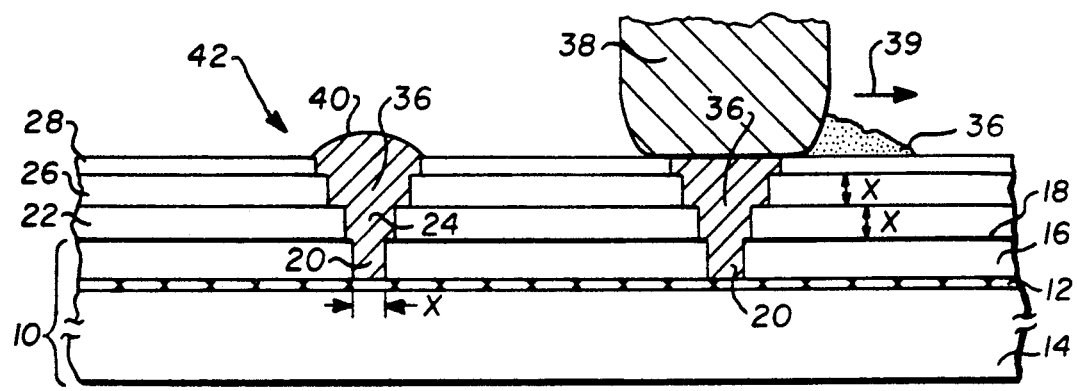
FIG. 1 is a cross sectional view illustrating the formation of conductive bumps prior to removal of the sacrificial layers.

Referring to FIG. 1, a substrate 10 is provided which includes a base layer 14. Base layer 14 includes a number of conductive (metal) and dielectric layers, and a core. Typically, these metal and dielectric layers are on the order of 5 to 10 kilo Ångstroms thick. Only a top metal layer 12 of base layer 14 is shown in FIG. 1. The conductive layers of base layer 14 have conductive patterns suited for circuit applications. For semi-custom substrate fabrication, a passivation layer 16 is applied over metal layer 12. Passivation layer 16 is formed of a material such as silicon dioxide, silicon nitrite, photoresist or polyimide. A via 20 is etched into layer 16 by, for example, state of the art photosensitive passivation layer definition (described below). This exposes a portion of the surface of metal layer 12. Via 20 has a diameter X.

An etch stop layer 18, made of a metallic material such as aluminum, copper or gold, is then applied over the remaining portion of layer 16. Etch stop protection lends layer 16 useable for a laser or laser-direct write application for final circuit layer customization. In the case of full custom substrate fabrication, it is assumed that substrate 10 is provided with passivation layer 16, etch stop layer 18 and via 20.

A sacrificial layer 22 is then applied next to etch stop layer 16. Sacrificial layer 22, as well as other sacrificial layers used in the invention are made from a material such as photoresist or polyimide. The thickness of layer 22 is preferably approximately the same size as the diameter X of via 20. A via 24 is etched in layer 22 by positive photosensitive sacrificial layer definition. This is accomplished by exposing layer 22 to actinic (e.g. visible or ultraviolet) radiation in all areas except where via 24 is to be located. This exposure causes a chemical crosslinking of the material so exposed. Layer 22 is then exposed to an aqueous solution for positive photoresist or a solvent for negative photoresist. This exposure dissolves layer 22 only where it is not exposed to the radiation. The result is via 24. Via 24 is created such that its diameter is slightly larger than the diameter X of via 20. This difference in diameters allows for etch and alignment tolerances.

Figure 2:
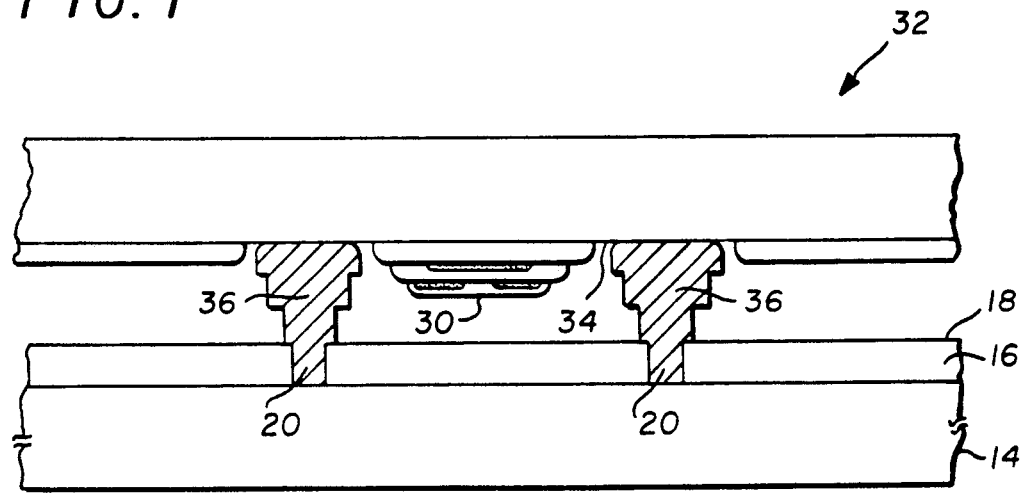
FIG. 2 is a cross sectional view illustrating two formed bumps after removal of the sacrificial layers with a semiconductor die attached to the bumps.

Additional sacrificial layers 26 and 28 may be applied over layer 22 with a via being created in each layer after it is applied. Each via is essentially aligned with and is slightly larger in diameter than the via previously created. Additional sacrificial layers 26 and 28 are formed using the technique described for forming layer 22. Enough sacrificial layers are applied such that the bump which will be created has a desired height. Typically, three sacrificial layers will be used to create a bump with a height of about 50 microns. The desired height is that which will insure that a highest point 30 on a semiconductor die 32 (see FIG. 2) clears etch stop layer 18 after die 32 has been flip chip mounted to the substrate.

The vias created in layers 16, 18, 22, 26 and 28 are filled with a thick, viscous conductive paste 36, that includes gold or aluminum, by a screen printing roller 38. Roller 38 is moved in the direction of an arrow 39 and squeezes the paste 36 into the vias. The pressure during the roller application and subsequent release of roller 38 coupled with surface tension of paste 36 creates a convex meniscus 40 on the surface of bump 42. This is the desired geometry for this portion of the bump. The paste in the vias is cured by exposing the paste to elevated temperatures. After paste 36 has been cured, sacrificial layers 22, 26 and 28 are removed by contacting them with a solvent, such as a strong acid or alkali solution, or by a plasma etching technique. This exposes bump 42 which may be seen more clearly in FIG. 2.

Figure 3:
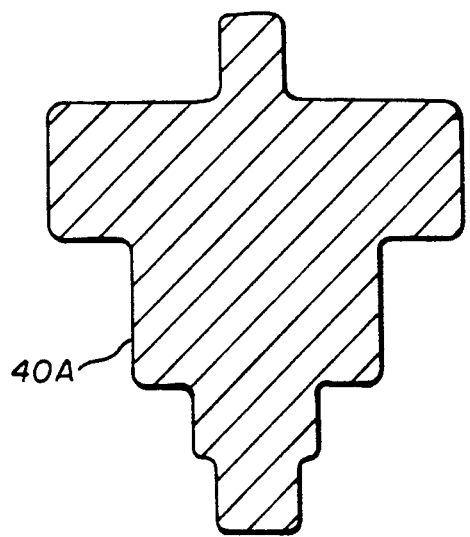
FIG. 3 is a cross sectional view illustrating an alternative geometry for a bump.

The final sacrificial layer 28 can be varied in thickness, and its associated via can be varied in diameter, to achieve an optimal aspect ratio for the desired accurate geometry control of the bump near a semiconductor input/output pad interface 34. Such a bump geometry is displayed in FIG. 3. At this location a ground or shield metal may require precise geometries to eliminate potential electrical shorting. This will provide increased accuracy at the semiconductor attachment end of the bump.

The invention has been described in detail with particular reference to preferred embodiments thereof, but it will be understood that variations and modifications can be effected within the spirit and scope of the invention.

What is claimed is:

1. A method of forming a conductive bump on a conductive surface comprising the steps of:
   (a) providing a substrate which includes said conductive surface, a passivation layer next to said conductive surface and an etch stop layer next to said passivation layer, said etch stop and passivation layers having a via therethrough exposing a portion of said conductive surface;
   (b) forming at least one sacrificial layer next to said etch stop layer, each sacrificial layer having a via there through which has a larger diameter than, and which is essentially aligned with, the via in the layer located (i) next to said sacrificial layer and (ii) closer to said conductive surface;
   (c) filling the vias with a conductive paste;
   (d) allowing said conductive paste to cure; and
   (e) removing the sacrificial layer(s) to expose said bump.

2. A method of forming a conductive bump on a conductive surface as defined in claim 1 wherein each sacrificial layer has a thickness which is substantially equal to the diameter of the via located in the permanent passivation layer.

3. A method of forming a conductive bump on a conductive surface as defined in claim 2 wherein a sacrificial layer furthest from said conductive surface has a thickness, and a via diameter, such that an aspect ratio is achieved for the desired accurate geometry control of the bump.

4. A method of forming a conductive bump on a conductive surface as defined in claim 3 wherein said bump has a surface which is convex in shape.

5. A method of forming a conductive bump on a conductive surface as defined in claim 1 wherein a sacrificial layer furthest from said conductive surface has a thickness, and a via diameter, such that an aspect ratio is achieved for the desired accurate geometry control of the bump.

6. A method of forming a conductive bump on a conductive surface as defined in claim 5 wherein said bump has a surface which is convex in shape.

7. A method of forming a conductive bump on a conductive surface as defined in claim 1 wherein said bump has a surface which is convex in shape.

* * * * *